United States Patent [19]

Napier

[11] Patent Number: 5,057,795
[45] Date of Patent: Oct. 15, 1991

[54] DIGITAL GAUSSIAN WHITE NOISE GENERATION SYSTEM AND METHOD OF USE

[75] Inventor: Thomas M. Napier, North Wales, Pa.

[73] Assignee: Aydin Corporation, Horsham, Pa.

[21] Appl. No.: 603,573

[22] Filed: Oct. 25, 1990

[51] Int. Cl.[5] .................... H03B 29/00; H03K 3/84
[52] U.S. Cl. ................................. 331/78; 364/717
[58] Field of Search ..................... 331/78; 364/717; 328/63

[56] References Cited

U.S. PATENT DOCUMENTS 3,742,381  6/1973  Hurd ................................. 331/78

Primary Examiner—Siegfried H. Grimm
Attorney, Agent, or Firm—Caesar, Rivise, Bernstein, Cohen & Pokotilow, Ltd.

[57] ABSTRACT

Apparatus for digitally synthesizing substantially Gaussian white noise of an adjustable bandwidth but of substantially constant amplitude. The apparatus comprises a pair of pseudorandom sequence generators, plural delay circuits, plural finite impulse response filters, and a summing network. The pseudorandom sequence generators are made up of a pair of shift registers having a large plurality of output stages to provide a first digital electrical signal representing a pseudorandom number sequence of a long repetition rate at the output stages. The delay circuits are coupled to selected output stages of the pseudorandom sequence generators for providing second respective digital electrical signals representing respective uncorrelated pseudorandom number sequences whose spectrum is a predetermined function, e.g., (sine X)/X. The finite impulse response filters are binary weighted and coupled to respective ones of the delay circuits for cancelling the predetermined function spectrum of the pseudorandom number sequence of the second electrical signals to produce respective first analog electrical signals of substantially uniform amplitude distribution. The summing network is coupled to the finite impulse response filters to sum the first analog electrical signals to produce an analog white noise signal of substantially Gaussian distribution.

34 Claims, 2 Drawing Sheets

DIGITAL GAUSSIAN WHITE NOISE GENERATION SYSTEM AND METHOD OF USE

This invention relates generally to apparatus and methods of generating electrical noise, and more particularly to apparatus and methods of generating Gaussian white noise.

BACKGROUND OF THE INVENTION

In order to test communication and other electronic equipment, noise generators are frequently utilized. The most common type of noise source is an analog device which relies upon a thermal noise diode to generate Gaussian noise.

In particular, commercial noise sources generally depend on the statistics of electron flow across PN junctions to generate noise which has a Gaussian amplitude distribution and a flat frequency spectrum. Generally, the noise power level is known only approximately and it will vary with time and the ambient temperature. The testing of electronic equipment at high bit rates typically requires a wide band noise source. For some testing applications, e.g., to match a lower data rate, the noise can be filtered to reduce its bandwidth. However, this results in a concomitant reduction in the amplitude of the noise, thereby requiring amplification to restore the noise to its original level. Thus, for some testing applications a number of analog noise generators, each providing a different bandwidth, are utilized to cover the desired bit rate range. However, such an approach is not without some drawbacks, e.g., precise amplification of the various generators must be achieved.

The generation of noise via the use of a digital source has been proposed as an alternative to analog noise generation. In this connection pseudorandom binary sequence generators, e.g., shift registers, have been used as noise sources in commercial instruments for some time. Typically, analog noise is generated from the binary output of such registers by severely limiting its bandwidth with an analog low-pass filter. Alternatively, it has been proposed (See Lipson, Foster and Walsh, "A Versatile Pseudorandom Noise Generator," IEEE Trans. Instrumentation and Measurement, Vol. 25, No. 2, June 1976) to use a weighted sum of the binary levels at various points on a shift register to synthesize a digital signal. This approach generates an approximately Gaussian amplitude distribution while also flattening the output frequency spectrum. However, the resultant noise bandwidth is severely limited, e.g., is 1/20 of the clock frequency at which the shift register is shifted.

Another approach to the synthesis of noise via digital techniques is to utilize a digital filter to generate a Gaussian amplitude distribution, but with the same (sine X)/X bandwidth distribution as the input sequence. (See Rowe and Kerr, "A Broad-Spectrum Pseudorandom Gaussian Noise Generator", IEEE Trans. Automatic Control, Vol. AC-15, No. 5, October 1970). Accordingly, this approach does not meet the requirement for flat noise spectrum.

The concept of separating the function of generating a flat frequency response from that of generating a Gaussian amplitude response has been discussed (See, Neuvo and Ku, "Analysis and Digital Realization of A Pseudorandom Gaussian and Impulsive Noise Source", IEEE Trans. on Communications, Vol. COM-23, No. 9, Sept. 1975). However, this approach has not been applied to real-time generation of wide band noise.

Still another approach to digital synthesis of noise has been proposed. That approach utilizes plural digitally generated noise samples for generating an analog output by means of a digital-to-analog converter. (See Kafadar, "Gaussian WhiteNoise Generation for Digital Signal Synthesis", IEEE Trans. Instrumentation and Measurement, Vol. IM-35, No. 4, Dec. 1986). However, with such an approach, if processing is done in real time the noise bandwidth is limited by the processor speed. If random-stored values are used, the requirement for some values to occur with low probability makes the memory size prohibitive.

OBJECTS OF THE INVENTION

Accordingly, it is the general object of this invention to provide apparatus and a method for digitally generating Gaussian noise which overcomes the disadvantages of the prior art.

It is a further object of this invention to provide apparatus and a method for digitally generating Gaussian noise which is white, that is, which has substantially constant power output per unit frequency interval.

It is a further object of this invention to provide apparatus and a method for digitally generating Gaussian white noise of a wide bandwidth and of substantially constant amplitude.

It is a further object of this invention to provide apparatus and a method for digitally generating Gaussian white noise having an adjustable bandwidth.

It is a further object of this invention to provide apparatus and a method for digitally generating Gaussian white noise of substantially constant amplitude which is relatively simple in construction.

It is a further object of this invention to provide apparatus and a method for digitally generating Gaussian white noise of substantially constant amplitude and wherein the ratio of the peak amplitude of the noise to its rms value meets commercial standards.

It is a further object of this invention to provide apparatus and a method for digitally generating Gaussian white noise of substantially constant amplitude utilizing finite impulse response filters which are binary weighted.

SUMMARY OF THE INVENTION

These and other objects of the instant invention are achieved by providing a method and apparatus for digitally synthesizing substantially Gaussian white noise of an adjustable bandwidth and of substantially constant amplitude.

The apparatus comprises pseudorandom sequence generation means, delay generation means, finite impulse response filter means, and summing means. The pseudorandom sequence generation means has a large plurality of output stages and is arranged for providing first digital electrical signals representing pseudorandom number sequences of a long repetition rate at the output stages. The delay generation means is coupled to selected output stages of the pseudorandom sequence generation means for providing second respective digital electrical signals representing respective uncorrelated pseudorandom number sequences whose spectrum is a predetermined function. The finite impulse response filter means is weighted and coupled to respective ones of the delay generation means for altering the predetermined function spectrum of the pseudorandom number sequence of the second electrical signals to produce respective first analog electrical signals of substantially uniform amplitude distribution. The summing means is coupled to the finite impulse response filter means for summing the first analog electrical signals to produce an analog white noise signal of substantially Gaussian distribution.

The method entails providing first digital electrical signals representing pseudorandom number sequences of a long repetition rate, delaying selected ones of the first digital signals to produce second respective digital electrical signals representing respective uncorrelated pseudorandom number sequences whose spectrum is a predetermined function, and altering the predetermined function spectrum of the pseudorandom number sequence of the second electrical signals to produce respective first analog electrical signals of substantially uniform amplitude distribution. The first analog electrical signals are then summed to produce an analog white noise signal of substantially Gaussian distribution.

DESCRIPTION OF THE DRAWINGS

Other objects and many of the attendant of advantages this invention will be readily appreciated as the same becomes better understood by reference to the following detailed description when considered in connection with the accompanying drawings wherein.

DETAILED DESCRIPTION OF THE PREFERRED EMBODIMENT

Figure 1:
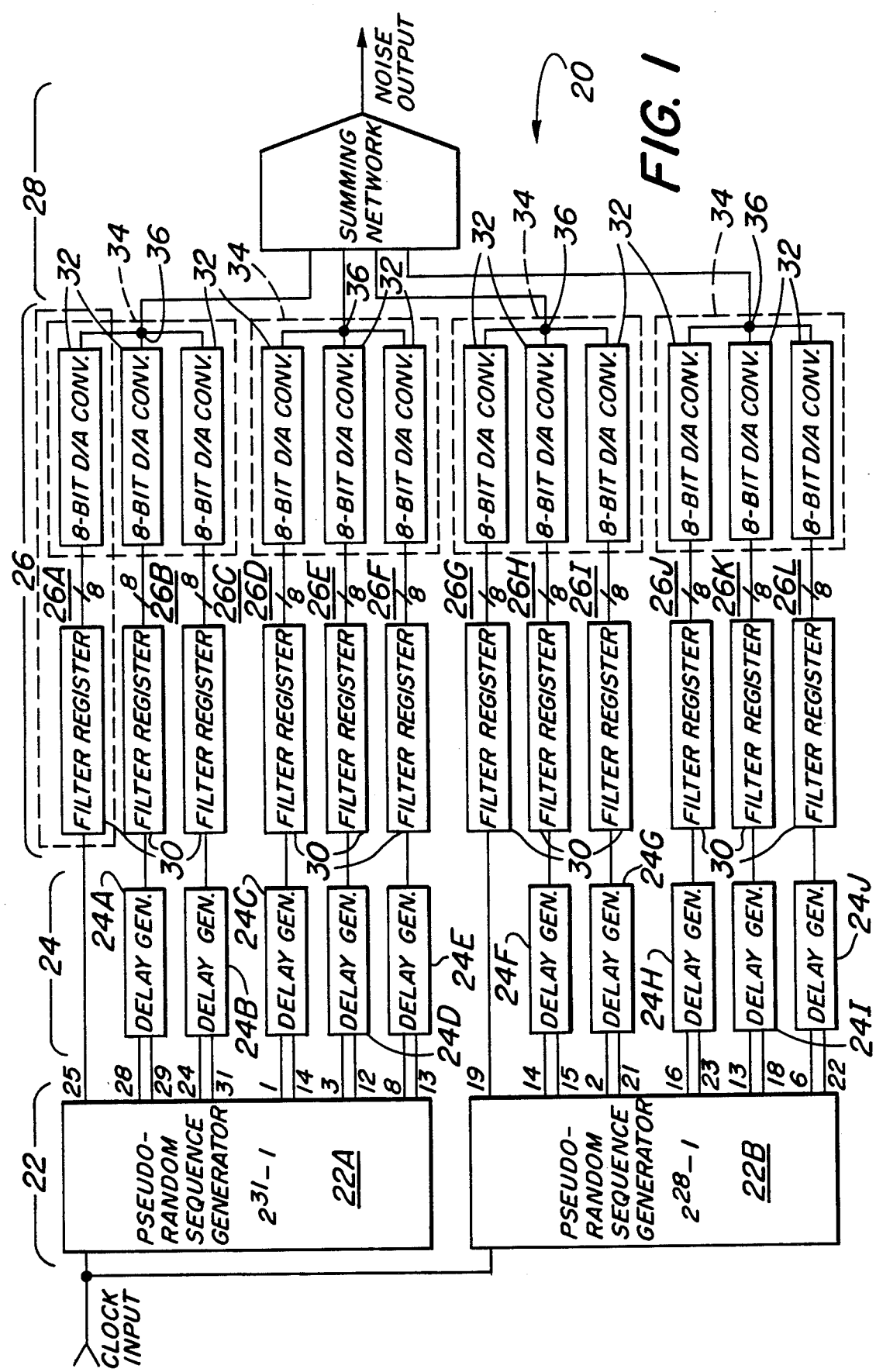
FIG. 1 is a block diagram of a digital Gaussian white noise generation system constructed in accordance with this invention.

Referring now in detail to the various figures of the drawing wherein like reference characters refer to like parts, there is shown at 20 in FIG. 1 apparatus for generating an electrical signal of Gaussian white noise constructed in accordance with the subject invention.

As will be appreciated by those skilled in the art from the description to follow the apparatus 20 is arranged to be clocked (tuned) over a wide range of bandwidths, e.g., from zero to the maximum operating clock frequency rate of the digital components making up the apparatus, to provide a noise signal whose bandwidth is proportional to the driving clock frequency Moreover, at all bandwidths the noise signal produced by the apparatus 20 has a constant RMS voltage, and a well-defined, closely Gaussian amplitude distribution. In the preferred embodiment shown and described herein the noise frequency spectrum is flat within 0.3 dB from dc to 45 percent of the clock frequency. As one varies the frequency of the clock frequency signal, the band width of the noise provided by the apparatus varies in proportion thereto, with the 3 db point of the noise being 55% of the clock frequency. Thus, the bandwidth of the output noise is approximately one-half the clock frequency, whereupon if a 200 MHz clock signal (which is achievable at the present state of the art) is used to clock the apparatus 20 a 100 MHz bandwidth noise signal is produced. Accordingly, the apparatus of the subject invention can be used to test communications equipment and electronic systems over a wide range of data rates, and without any of the drawbacks of prior art analog or digital noise sources.

The details of the construction and the operation of the apparatus 20 will be described in detail later. Suffice for now to state that the apparatus 20 basically utilizes a pseudorandom sequence generator 22 and associated delay means 24 to generate plural, effectively uncorrelated, pseudorandom binary sequences having a frequency spectrum of a (sine X)/X function. It should be noted that the remainder of this application will use the term uncorrelated to describe the pseudorandom member sequences produced, even though such sequences are not truly uncorrelated, but rather only "effectively" uncorrelated.

Each of the uncorrelated pseudorandom number sequences are then provided to finite impulse response filter means 24 where the (sine X)/X function of each sequence is cancelled and converted to provide respective analog signals, each having a level frequency spectrum.

The analog signals are then summed by a summing network 28 to produce the desired Gaussian amplitude distribution. output noise is approximately one-half the clock frequency, whereupon if a 200 MHz clock signal (which is achievable at the present state of the art) is used to clock the apparatus 20 a 100 MHz bandwidth noise signal is produced. Accordingly, the apparatus of the subject invention can be used to test communications equipment and electronic systems over a wide range of data rates, and without any of the drawbacks of prior art analog or digital noise sources.

The details of the construction and the operation of the apparatus 20 will be described in detail later. Suffice for now to state that the apparatus 20 basically utilizes a pseudorandom sequence generator 22 and associated delay means 24 to generate plural, effectively uncorrelated, pseudorandom binary sequences having a frequency spectrum of a (sine X)/X function. It should be noted that the remainder of this application will use the term uncorrelated to describe the pseudorandom number sequences produced, even though such sequences are not truly uncorrelated, but rather only "effectively" uncorrelated.

Each of the uncorrelated pseudorandom number sequences are then provided to finite impulse response filter means 26 where the (sine X)/X function of each sequence is cancelled and converted to provide respective analog signals, each having a level frequency spectrum.

The analog signals are then summed by a summing network 28 to produce the desired Gaussian amplitude distribution.

In accordance with a preferred embodiment of this invention twelve pseudorandom sequences are produced in order that the resulting noise signal exceeds commercial standards, e.g., the ratio of the peak amplitude of the noise to the rms value thereof is at least five.

As can be seen in FIG. 1 the pseudorandom sequence generator means 22 basically comprises a pair of shift registers 22A and 22B. Shift register 22A is a thirty-one stage shift register and shift register 22B is a twenty-eight stage shift register. The registers are arranged to be clocked simultaneously by a clock input signal. Ideally, the twelve uncorrelated pseudorandom number sequences used by the subject invention would be generated by individual shift registers, one for each pseudorandom sequence. However, in the interest of simplicity of construction and cost, only two shift registers 22A and 22B are used herein, since such registers are each of sufficiently long length (i.e., 22A is thirty-one stages, while 22B is twenty-eight stages long) to ensure desired operation, i.e., that the plural pseudorandom sequences generated are different.

Since twelve pseudorandom sequences are used in the preferred embodiment of this invention, the shift register 22A is arranged to provide six digital signals, each representing a respective pseudorandom sequence, while the register 22B provides the other six such signals.

The clock input signal which controls the bandwidth of the generated noise is supplied externally by means (not shown) and drives the two shift registers 22A and 22B, as well as other parts of the apparatus. The shift registers 22A and 22B may be driven by either or both edges of the clock signal. Moreover, circuitry (not shown) is incorporated in the apparatus 20 to ensure that the shift registers 22A and 22B do not remain in the state in which all of their stages contain zeros. The shift registers 22A and 22B generate sequences which repeat, respectively, in 2,147,483,647 and 268,435,455 clock periods. This ensures that the output noise is not repeated during any plausible test time. For example, at a 100 MHz clock rate, the cycle time is 183 years. While the shift registers 22A and 22B are shown as having a specific number of stages other shift register lengths may be used.

It should be pointed out at this juncture that the pseudorandom sequence generator means could have been made up of only a single shift register providing the desired number of output stages to generate the twelve uncorrelated pseudorandom number sequences. However, in the interest of increasing the cycle time, two such registers are used.

In order to insure that the twelve pseudorandom sequences are uncorrelated, five of the sequences from each register are provided to the delay generation means 24. The delay generation means 24 basically comprises ten respective delay circuits 24A, 24B, 24C, 24D, 24E, 24F, 24G, 24H, 24I and 24J.

Each of the delay circuits comprises a respective exclusive-OR gate. As will be appreciated by those skilled in the art it is a well-known property of an exclusive-OR gate that its output is the same sequence as the input sequence but delayed in time relative thereto. Thus, the exclusive-OR gates provide a convenient and cost effective means for delaying the respective input sequences to produce uncorrelated output sequences. The delay generation circuits 24A-24E are connected to selected outputs of the shift register 22A and the delay generation circuits 24F-24J are connected to selected outputs of the shift register 22B to provide respective electrical digital output signals, each representative of an uncorrelated pseudorandom sequence. These ten output signals are provided along with two direct output signals from the shift registers 22A and 22B to produce the twelve uncorrelated pseudorandom sequences electrical signals which are acted upon by the finite impulse response filter means 26.

Before discussing the finite impulse response filter means 26, the construction and operation of the sequence generator shift register 22A and 22B and the associated delay generators 24A-24J will now be described. Thus, as can be seen in FIG. 1, output stage 28 of the shift register 22A is connected to one input line of the delay generator circuit 24A. The other input to the delay generator circuit 24A is provided via the shift register output stage 29. In a like manner, shift register 22A output stages 24 and 31 are provided as the input lines to the delay generator 24B. Output stages 1 and 14 of shift register 22A are connected as the inputs of delay generator 24C. Output stages 3 and 12 of the shift register 22A are connected as inputs to the delay generator 24D. Output stages 8 and 13 of the shift register 22A are connected as the inputs to the delay generator 24E. Output stages 14 and 15 of the shift register 24B are connected as the inputs to the delay generator 22F. In a like manner the output stages 2 and 21 of shift register 22B are connected as the inputs to the delay generator 24G. Output stages 16 and 23 of shift register 22B are connected as the inputs to the delay generator 24H. Output stages 13 and 18 of shift register 22B are connected as the inputs to the delay generator 24I, and output stages 6 and 22 of shift register 22B are connected as the inputs to the delay generator 24J.

Irrespective of the number of pseudorandom sequence generator shift registers used or their length, the output signals provided at their selected output stages are delayed by their respective delay generators to insure that those sequences are effectively uncorrelated, i.e., short segments of the sequences are uncorrelated although they have a consistent time relationship with one another. Inasmuch as the delay generation circuits each comprise exclusive OR gates, the time delay produced by each is long relative to the length of the shift registers. Moreover, by selecting taps or outputs of the various stages of the shift registers 22A and 22B which are substantially far apart, there is no practical correlation between the signals provided to the finite impulse response filtering means 26.

The specific combination of taps of the shift registers 22A and 22B which provide inputs to the delay generation means 24 which are shown and described herein, while effective, nevertheless are merely exemplary. Thus, such taps do not constitute the only possible sequence which may be utilized to insure that the delays are large and not closely related to each other so the twelve pseudorandom sequences are effectively uncorrelated. In this connection it is desirable that the delays be chosen to be large fractions of the maximum length of the pseudorandom sequences and to have no common divisors. Moreover, in the interest of speed of operation of the apparatus 20 it is desirable that no shift register output stage drive more than one exclusive-OR gate.

As can be seen in FIG. 1 two outputs of the pseudorandom sequence generation means 22 are provided directly to the finite impulse response filter means 26. In particular, output stage 25 of shift register 22A and output stage 19 of the shift register 22B are each provided directly the filter means 26. As should be appreciated by those skilled in the art there is no need to delay such signals since the delay generators 24A-24E associated with shift register 22A ensure that each of their outputs is delayed relative to one another and to the output appearing at output stage 25 of shift register 22A. So too, the delay generators 24F-24J associated with shift register 22B ensure that each of their outputs is delayed relative to one another and to the output appearing at output stage 19 of shift register 22B.

Figure 2:
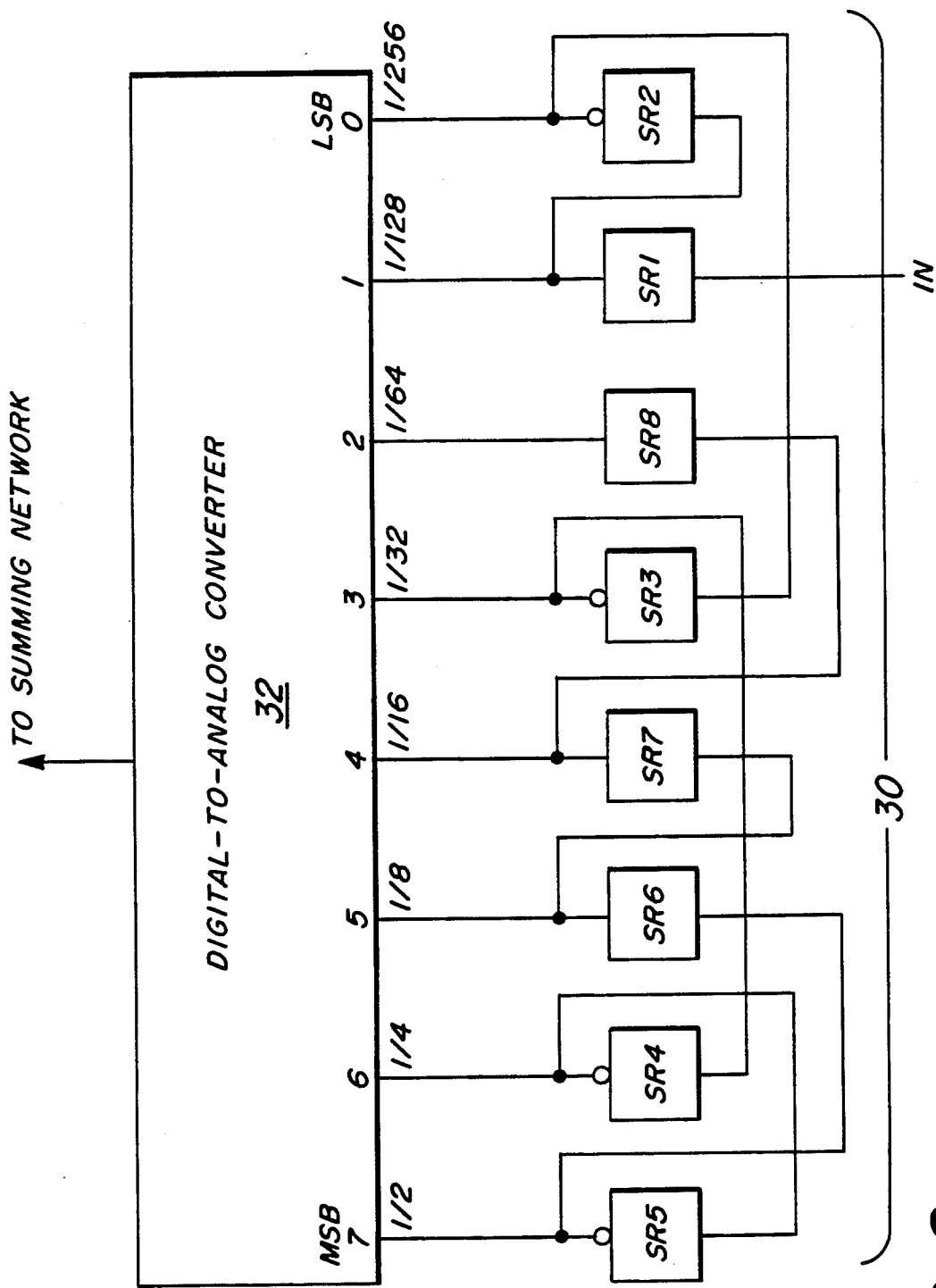
FIG. 2 is a schematic diagram of a portion of the system shown in FIG. 1.

The finite impulse response filtering means 26 comprises twelve finite impulse filters 26A-26L. Each of the filters is arranged to receive a respective one of the twelve electrical signals representing the twelve uncorrelated pseudorandom binary sequences. As can be seen in FIG. 2 each filter 26A-26F includes a filter register 30 and an associated eight-bit digital-to-analog converter 32 which is driven by the register 30. Each filter register 30 basically comprises a conventional, eight-bit, shift register. Thus, the register 30 has eight output stages, each of which is connected to a respective input line of a the associated digital-to-analog converter 32. Each of the digital-to-analog converters 32 is a conventional device which is rated to operate at an update rate of 250 Mwords per second. The eight parallel output lines of the shift register 30 and which are connected to the inputs of the eight-bit digital-to-analog converter 32 are shown in FIG. 1 by a single line (bearing the legend "/8"), whereas all eight input lines are shown in the schematic diagram of FIG. 2.

Before discussing the interconnection of the filter register 30 to the associated digital-to-analog converter 32, the connection of the various finite impulse filters 26A-26L to the pseudorandom sequence generators 22A and 22B and the associated delay generators 24A-24J will now be described with reference to FIG. 1. Thus, as can be seen, the undelayed output provided by stage 25 of the pseudorandom sequence generator shift register 22A is provided as the input to filter register 30 of filter 26A. The output of delay generator 24A is provided as the input to the filter register 30 of filter 26B. In a similar manner the outputs of delay generators 24B-24E are provided as inputs to the filter registers 30 of the filters 26B-26F, respectively. The undelayed output signal appearing on stage 19 of the pseudorandom sequence generator shift register 22B is provided as the input to the filter register 30 of the finite impulse response filter 26G. The outputs from the delay generators 24F-24J are provided as inputs to the filter registers 30 of the finite impulse response filters 26H-26L, respectively.

Each of the finite impulse response filters 26A-26L is arranged to cancel or otherwise compensate the (sine X)/X function of its input signal and in s doing provide a uniform amplitude distribution (as opposed to the binary amplitude distribution of the input). The uniform output distribution is converted into an analog signal by the eight-bit digital-to-analog converter 32. In order to produce the desired filter characteristic (weighting) of the filter to accomplish the (sine X)/X compensation, e.g., cancellation, function, the connections from the shift register 30 to the inputs from the shift register 30 the digital-to-analog converter 32 are ordered in a predetermined way as shown in FIG. 2. This implements the required digital filter and results in the generation of a signal having the desired frequency response at the output of the digital-to-analog converter. The weight supplied to each stage are in this case, related by powers of two (i.e., are binary weighted). Other weights may be used if a flatter frequency response is required. Thus the weighting as shown and described herein is merely exemplary. However, those weights coupled with the "window property" of a pseudorandom sequence insures that the output signal spends, on average, as much time at each of the 256 possible output levels of the converter 32.

It should also be pointed out that digital-to-analog converters having a greater or lesser number of input bits may be utilized.

Returning now to FIG. 2, it can be seen that the shift register 30 includes 8 sequentially connected stages. To that end the output of the shift register's first stage, SR1, is connected to the input of its second stage, SR2. The inverted output of SR2 is connected to the input of the register's third stage, SR3. The inverted output of the third stage, SR3, is provided as an input to the register's fourth stage, SR4. The inverted output of SR4 is provided as the input to the register's fifth stage, SR5. The inverted output of the fifth stage, SR5, is provided as the input to the register's sixth stage, SR6. The output of the sixth stage, SR6, is provided as the input to the register's seventh stage, SR7.

As mentioned earlier the digital-to-analog converter 32 is a conventional device having eight stages, namely stages 0, 1, 2, 3, 4, 5, 6, and 7, with stage 0 being the least significant input bit and stage 7 the most significant input bit. With the connections of the output states of the shift registers SR1-SR7 connected to the input stages of the digital-to-analog converter 32 as will be described hereinafter, the desired weighting to flatten the normal (sine X)/X distribution results.

Inasmuch as each of the stages of the digital-to-analog converter is related by a factor of two from the previous stage, the most significant bit, stage 7, can be deemed to provide a weighting factor of ½ to the digital, electrical signal provided to it. The next stage, namely, stage 6, provides a weighting of ¼ to the digital, electrical signal provided to it. The next stage, namely, stage 5, provides a weighting of ⅛ to the digital, electrical signal provided to it. The next stage, namely, stage 4, provides a weighting of 1/16 to the digital, electrical signal provided to it. The next stage, namely, stage 3, provides a weighting of 1/32 to the digital, electrical signal provided to it. The next stage, namely, stage 2, provides a weighting of 1/64 to the digital, electrical signal provided to it. The next stage, namely, stage 1, provides a weighting of 1/128 to the digital, electrical signal provided to it. The last stage, namely, the least significant bit stage 0, provides a weighting of 1/256 to the digital, electrical signal provided to it.

In order to effectively cancel, i.e., effectively flatten, the (sine X)/X function of the respective uncorrelated digital signals provided to the filters 26A-26L, the inverted output of the fifth stage, SR5, of each register 30, is connected as the input to stage 7 of its associated converter 32. The inverted output of the fourth stage, SR4, of each register 30 is connected to the sixth stage input of its associated converter 32. The output of the sixth stage, SR6, of each register 30 is connected as the input to the fifth stage of its associated converter 32. The output of the seventh stage, SR7, of each register 30 is connected as the input to the fourth stage of its associated converter 32. The inverted output of the third stage, SR3, of each register 30 is connected as the input to the third stage of its associated converter 32. The output of the eighth stage, SR8, of each register 30 is connected as the input to the second stage of its associated converter 32. The output of the first stage, SR1, of each register 30 is connected as the input to the first stage of its associated converter. Finally, the inverted output of the second stage, SR2, of each register 30 is connected as the input to the zero (i.e., least significant bit) stage of its associated converter 32. Accordingly, the input signal provided into the shift register 30 of each filter will be weighted by the various stages of the associated digital-to-analog converter 32 in accordance with the connections thereto to arrive at an analog output signal from the digital-to-analog converter representative of a uniform amplitude distribution spectrum of the input pseudorandom sequence.

The output signals from the eight-bit digital-to-analog converter 32 of the each of the filters 26A to 26L are provided to the summing network 28 where they are summed with equal weighting. This results in an analog white noise signal of substantially Gaussian distribution.

In the interest of expediting the construction of the apparatus 20 the eight bit digital-to-analog converters 32 are not formed of discrete components. Rather they are made up of four conventional, digital-to-analog converter chips 34, such as used to drive the red, blue and green inputs of a color television tube. Thus, each of those chips is made up of three, eight-bit digital-to-analog converters 32. The output of each of the eight-bit digital-to-analog converters 32 of each chip 34 are connected together at a summing point 36. Each of the summing points is connected to a respective input of the summing network 28. Accordingly, the output of the twelve, eight-bit digital-to-analog converters 32 are summed together by the summing network to provide the analog noise signal output.

It has been determined that providing twelve uncorrelated pseudorandom sequences to respective finite impulse response filters, as is accomplished by the preferred embodiment of this invention, generates a noise signal whose ratio of its peak amplitude to its RMS value is six. Moreover, the noise generated passes the chi-square test at the 1% level of significance, and has a kurtosis of 2.9. An even closer approximation to a Gaussian distribution can be achieved by increasing the number of stages, i.e., pseudorandom sequences and associated finite impulse response filters.

It is a generally accepted standard in the industry for a noise source to provide a noise signal having a peak to RMS noise amplitude ratio of five. Accordingly, the preferred embodiment of the apparatus 20 disclosed herein provides an output noise signal better than that commonly provided by most conventional noise sources. Moreover, a noise signal exhibiting a ratio characteristic of five can be produced in accordance with this invention by utilizing only nine pseudorandom sequences and associated finite impulse response filters. In fact, it has been determined that with as little as three pseudorandom sequences and associated finite impulse response filters, one can produce an output noise signal which approximates a Gaussian distribution.

As should be appreciated from the foregoing, the apparatus 20 of this invention is uniquely suited to accurate test precision electronic equipment, e.g., bit synchronizers at bit rates up to 50 Mbps. Moreover, its tunability over a wide frequency range, the flatness and close conformity of its output noise signal to a Gaussian distribution, make the apparatus an excellent noise source for general base-band test applications as well.

Without further elaboration, the foregoing will so fully illustrate my invention that others may, by applying current or future knowledge, readily adopt the same for use under variou conditions of service.

I claim:

1. Apparatus for digitally synthesizing substantially Gaussian white noise of an adjustable, wide bandwidth but of substantially constant amplitude, said apparatus comprising pseudorandom sequence generation means, delay generation means, finite impulse response filter means, and summing means, said pseudorandom sequence generation means having a large plurality of output stages and being arranged for providing first digital electrical signals representing a pseudorandom number sequence of a long repetition rate at said output stages, said delay generation means being coupled to selected output stages of said pseudorandom sequence generation means for providing second respective digital electrical signals representing respective uncorrelated pseudorandom number sequences whose spectrum is a predetermined function, said finite impulse response filter means being weighted and coupled to respective ones of said delay generation means for altering the predetermined function spectrum of the pseudorandom number sequences of said second electrical signals to produce respective first analog electrical signals of substantially uniform amplitude distribution, said summing means being coupled to said finite impulse response filter means for summing said first analog electrical signals to produce an analog white noise signal of substantially Gaussian distribution.

2. The apparatus of claim 1 wherein said finite impulse response filter means comprises a plurality of weighted filters.

3. The apparatus of claim 2 wherein said filters are weighted in a manner to substantially cancel the predetermined function spectrum of said second digital electrical signals.

4. The apparatus of claim 3 wherein said function is (sine X)/X.

5. The apparatus of claim 2 wherein each of said finite impulse response filters comprises a digital shift register and an associated digital-to-analog converter, said digital shift register having a plurality of output stages, said digital to analog converter having a plurality of input stages, and whereupon selected ones of said output stages of said shift register are connected to respective ones of the input stages of said digital-to-analog converter to effect a predetermined weighting of said second digital electrical signals to cancel the function of the second digital electrical signal provided thereto to produce said first analog electrical signal.

6. The apparatus of claim 5 wherein said function is (sine X)/X.

7. The apparatus of claim 1 wherein said pseudorandom sequence generation means comprises at least one multistage digital shift register.

8. The apparatus of claim 3 wherein said pseudorandom sequence generation means comprises at least one multistage digital shift register.

9. The apparatus of claim 5 wherein said pseudorandom sequence generation means comprises at least one multistage digital shift register.

10. The apparatus of claim 1 wherein said delay generation means comprises a plurality of exclusive-OR gates.

11. The apparatus of claim 1 wherein said weighting is binary related.

12. The apparatus of claim 3 wherein said weighting is binary related.

13. The apparatus of claim 5 wherein said weighting is binary related.

14. The apparatus of claim 7 wherein said weighting is binary related.

15. The apparatus of claim 1 wherein said pseudorandom sequence generation means is clocked at a preselected frequency, with said frequency being selectable to vary the bandwidth of said noise signal produced by said apparatus while maintaining said substantially Gaussian distribution.

16. The apparatus of claim 7 wherein said shift register is clocked at a preselected frequency, with said frequency being selectable to vary the bandwidth of said noise signal produced by said apparatus while maintaining said substantially Gaussian distribution.

17. The apparatus of claim 8 wherein said shift register is clocked at a preselected frequency, with said frequency being selectable to vary the bandwidth of said noise signal produced by said apparatus while maintaining said substantially Gaussian distribution.

18. The apparatus of claim 15 wherein said weighting is binary related.

19. The apparatus of claim 16 wherein said weighting is binary related.

20. The apparatus of claim 17 wherein said weighting is binary related.

21. The apparatus of claim 2 wherein said second digital signals comprise at least three signals, each being uncorrelated to the others, with a respective one of each of said second signals being provided to a respective filter.

22. The apparatus of claim 2 wherein said second digital signals comprise at least nine signals, each being uncorrelated to the others, with a respective one of each of said second signals being provided to a respective filter, whereupon the ratio of the peak amplitude of the noise produced by said apparatus to the rms value of said noise is at least five.

23. The apparatus of claim 2 wherein said second digital signals comprise at least twelve signals, each being uncorrelated to the others, with a respective one of each of said second signals being provided to a respective filter, whereupon the ratio of the peak amplitude of the noise produced by said apparatus to the rms value of said noise is at least six.

24. A method for digitally synthesizing substantially Gaussian white noise of an adjustable, wide bandwidth but of substantially constant amplitude, said method comprising providing first digital electrical signals representing pseudorandom number sequences of a long repetition rate, delaying selected ones of said first digital signals for providing second respective digital electrical signals representing respective uncorrelated pseudorandom number sequences whose spectrum is a predetermined function, altering the predetermined function spectrum of the pseudorandom number sequence of said second electrical signals to produce respective first analog electrical signals of substantially uniform amplitude distribution, and summing said first analog electrical signals to produce an analog white noise signal of substantially Gaussian distribution.

25. The method of claim 24 wherein said first analog electrical signals are produced by weighted filters which are binary related to cancel the function of the second digital electrical signals.

26. The method of claim 24 wherein said first digital electrical signals are produced in response to a preselected clock frequency, with said frequency being selectable to vary the bandwidth of said noise signal while maintaining said substantially Gaussian distribution.

27. The method of claim 25 wherein said first digital electrical signals are produced in response to a preselected clock frequency, with said frequency being selectable to vary the bandwidth of said noise signal while maintaining said substantially Gaussian distribution.

28. The method of claim 24 wherein said second digital signals comprise at least three signals, each being uncorrelated to the others, with a respective one of each of said second signals being provided to a respective filter for producing respective ones of said first analog electrical signals.

29. The method of claim 24 wherein said second digital signals comprise at least nine signals, each being uncorrelated to the others, with a respective one of each of said second signals being provided to a respective filter for producing respective ones of said first analog electrical signals, whereupon the ratio of the peak amplitude of the noise produced to the rms value of said noise is at least five.

30. The method of claim 24 wherein said second digital signals comprise at least twelve signals, each being uncorrelated to the others, with a respective one of each of said second signals being provided to a respective filter for producing respective ones of said first analog electrical signals, whereupon the ratio of the peak amplitude of the noise produced to the rms value of said noise is at least six.

31. The method of claim 25 wherein said second digital signals comprise at least three signals, each being uncorrelated to the others, with a respective one of each of said second signals being provided to a respective filter for producing respective ones of said first analog electrical signals.

32. The method of claim 25 wherein said second digital signals comprise at least nine signals, each being uncorrelated to the others, with a respective one of each of said second signals being provided to a respective filter for producing respective ones of said first analog electrical signals, whereupon the ratio of the peak amplitude of the noise produced to the rms value of said noise is at least five.

33. The method of claim 25 wherein said second digital signals comprise at least twelve signals, each being uncorrelated to the others, with a respective one of each of said second signals being provided to a respective filter for producing respective ones of said first analog electrical signals, whereupon the ratio of the peak amplitude of the noise produced to the rms value of said noise is at least six.

34. The method of claim 24 wherein said delaying of selected one of said first digital signals is accomplished by use of respective exclusive-OR gates.

* * * * *